United States Patent
Li et al.

(10) Patent No.: US 11,723,278 B2
(45) Date of Patent: Aug. 8, 2023

(54) PHOTO-INDUCED TUNABLE METAMATERIAL

(71) Applicant: Toyota Motor Engineering & Manufacturing North America, Inc., Plano, TX (US)

(72) Inventors: Xiaopeng Li, Ann Arbor, MI (US); Taehwa Lee, Ann Arbor, MI (US); Hideo Iizuka, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 289 days.

(21) Appl. No.: 17/165,360

(22) Filed: Feb. 2, 2021

(65) Prior Publication Data

US 2022/0246823 A1 Aug. 4, 2022

(51) Int. Cl.
*H01L 41/09* (2006.01)
*H10N 30/80* (2023.01)
*H04R 17/00* (2006.01)
*H10N 30/20* (2023.01)

(52) U.S. Cl.
CPC .......... *H10N 30/802* (2023.02); *H04R 17/00* (2013.01); *H10N 30/2047* (2023.02)

(58) Field of Classification Search
CPC .............. H10N 30/2047; H10N 30/802; H01L 41/0973; H01L 41/042
See application file for complete search history.

(56) References Cited

U.S. PATENT DOCUMENTS 8,717,659 B2   5/2014   Zheludev et al.
8,921,789 B2   12/2014  Pryce et al.

OTHER PUBLICATIONS

Bao, B. et al., "Elastic wave manipulation in piezoelectric beam meta-structure using electronic negative capacitance dual-adjacent/staggered connections," Composite Structures 210 (2019) pp. 567-580.
Gliozzi, A. et al., "Tunable photo-responsive elastic metamaterials," Nature Communications 11, Article No. 2576 (2020) pp. 1-8.
Bao, B. et al., "Manipulating elastic waves through piezoelectric metamaterial with nonlinear electrical switched Dual-connected topologies," International Journal of Mechanical Sciences, vol. 172 (2020) 105423 17 pages.

*Primary Examiner* — Derek J Rosenau
(74) *Attorney, Agent, or Firm* — Christopher G. Darrow; Darrow Mustafa PC

(57) ABSTRACT

A tunable metamaterial structure can have a flexible substrate that is elastically deformable. The tunable metamaterial structure can have a photo-responsive stiffness-modulating patch. The photo-responsive stiffness-modulating patch can be fixed to a surface of the flexible substrate. The photo-responsive stiffness-modulating patch can include a piezoelectric element and a photo-responsive element. The piezoelectric element and the photo-responsive element are electrically connected to one another.

20 Claims, 3 Drawing Sheets

PHOTO-INDUCED TUNABLE METAMATERIAL

FIELD

The subject matter described herein relates in general to tunable metamaterials and non-linear metamaterials.

BACKGROUND

Passive metamaterials are used to control elastic or acoustic waves. The metamaterials can control the elastic waves based on the effective material parameters, such as effective negative mass densities, effective negative modulus, etc., of the metamaterials. However, the effective material parameters of certain metamaterials are fixed and not tunable once the metamaterial has been fabricated. To design tunable elastic metamaterials, it is still a challenging task due to fairly complex and expensive fabrications.

SUMMARY

In one respect, the subject matter presented herein relates to a tunable metamaterial structure which is composed of an array of unit cells. The tunable metamaterial structure can have a flexible substrate that is elastically deformable. The unit cell of the tunable metamaterial structure can have a photo-responsive stiffness-modulating patch. The photo-responsive stiffness-modulating patch can be fixed to a surface of the flexible substrate. The photo-responsive stiffness-modulating patch can include a piezoelectric element and a photo-responsive element. The piezoelectric element and the photo-responsive element can be electrically connected to one another.

In another respect, the subject matter presented herein relates to a tunable metamaterial structure. The tunable metamaterial structure can have a flexible substrate that is elastically deformable. The unit cell of the tunable metamaterial structure can have a plurality of photo-responsive stiffness-modulating patches. The plurality of photo-responsive stiffness-modulating patches can be fixed to a surface of the flexible substrate and form an array that can be random or uniform. The photo-responsive stiffness-modulating patch can include a piezoelectric element and a photo-responsive element. The piezoelectric element and the photo-responsive element can be electrically connected to one another.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. In some embodiments, one element may be designed as multiple elements or multiple elements may be designed as one element. In some embodiments, an element shown as an internal component of another element may be implemented as an external component and vice versa. Furthermore, elements may not be drawn to scale.

DETAILED DESCRIPTION

Figure 1:
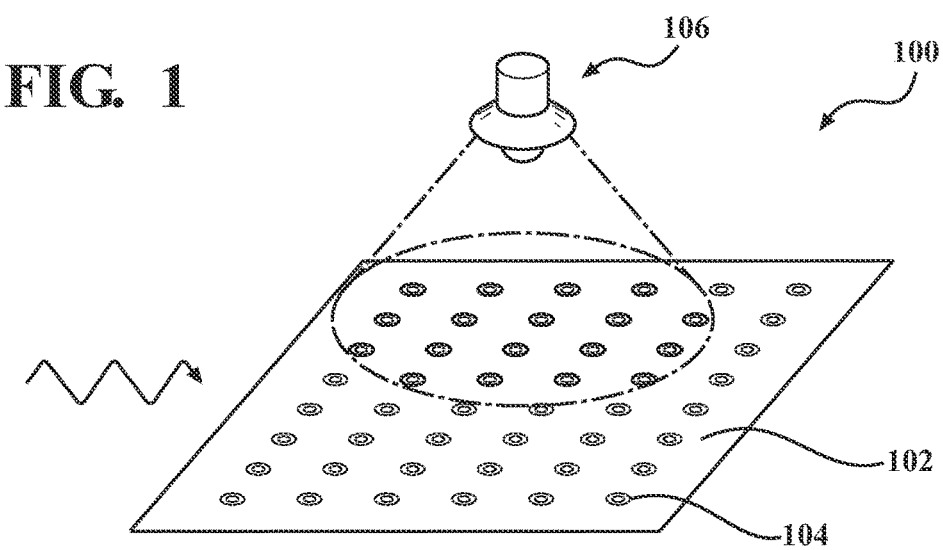
FIG. 1 is an example of a tunable metamaterial structure.

Metamaterials can be used to control elastic or acoustic waves. The metamaterials can manipulate the elastic or acoustic waves by controlling of the effective material parameters metamaterial. While some metamaterials have fixed functionalities as well as fixed bandwidth, which means that the characteristics such as the effective material parameters of the metamaterials are set when the metamaterials are fabricated, others can be tunable metamaterials. Characteristics such as the effective material parameters of a tunable metamaterial can be adjusted after it has been fabricated. Some investigations have been done with negative capacitance shunted piezoelectric patches to design tunable metamaterials by manually changing the shunting circuit parameters.

The metamaterials with tunable effective material parameter can be tuned in response to electric or magnetic fields, temperature, radio waves and mechanical stimuli. However, these metamaterials are often impractical for real-world implementations. Further, these metamaterials can be difficult to fabricate. As an example, tunable metamaterials can be fabricated using fairly complex methods and materials such as UV-polymerization of Bisphenol A Ethoxylate and a BAPO photoinitiator in a DLP system.

Arrangements presented herein are directed to a tunable metamaterial structure that can be generated using simpler components, resulting in higher yields and lower manufacturing costs. The tunable metamaterial structure disclosed can be fabricated using traditional materials such as piezoelectric elements and photo-responsive elements made from easily accessible electrical components such as photo-resistors, capacitors, fixed resistors, and amplifiers.

The effective elastic properties of the tunable metamaterial structure can be adjusted in response to exposure to light. Further, the effective elastic properties of a portion of the tunable metamaterial structure can be adjusted in response to the portion of the tunable metamaterial structure being exposed to light.

As an example, the tunable metamaterial structure can include a flexible substrate and a plurality of photo-responsive stiffness-modulating patches, fixed to the flexible substrate in a uniform grid-like pattern. The photo-responsive stiffness-modulating patch can include a piezoelectric element and a photo-responsive element that are electrically connected to each other.

The photo-responsive element can include circuitry that has a photo-resistor. In response to being exposed to a light source, the resistance in the photo-resistor can be altered. The resistance can be directly proportional to the amount of light being received by the photo-resistor.

This photo-responsive element is embedded in a negative capacitance circuit, which is shunted to a piezoelectric element. In response to different amounts of light through the photo-resistor and through the negative capacitance circuit, the effective stiffness of the piezoelectric element can change.

As the piezoelectric elements soften or stiffen, the photo-responsive stiffness-modulating patches soften or stiffen. As such, the plurality of photo-responsive stiffness-modulating patches may be exposed to light and respond by either stiffening or softening. In such an example, the flexible substrate can become stiffer or softer. The flexible substrate may become more flexible when the plurality of photo-responsive stiffness-modulating patches are stiff, and the flexible substrate may become less flexible when the plurality of photo-responsive stiffness-modulating patches are soft. The effective parameters, e.g., the softening or stiffening of the photo-responsive stiffness-modulating patch can be directly proportionally to the amount of light received. As such, the circuit parameter of the photo-responsive stiffness-modulating patch can be controlled with precision by controlling the amount of light the photo-responsive stiffness-modulating patch receives. By tuning the circuit parameter, the effective property of the metamaterial is changed and, therefore, controlling the wave propagating behaviors or bandwidths in the metamaterial.

Detailed embodiments are disclosed herein; however, it is to be understood that the disclosed embodiments are intended only as examples. Therefore, specific structural and functional details disclosed herein are not to be interpreted as limiting, but merely as a basis for the claims and as a representative basis for teaching one skilled in the art to variously employ the aspects herein in virtually any appropriately detailed structure. Further, the terms and phrases used herein are not intended to be limiting but rather to provide an understandable description of possible implementations. Various embodiments are shown in FIGS. 1-4, but the embodiments are not limited to the illustrated structure or application.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details.

Referring to FIG. 1, an example of a tunable metamaterial structure 100 is shown. The tunable metamaterial structure 100 can include various elements, which can be connected in any suitable form. As an example, the elements can be connected as shown in FIG. 1. Some of the possible elements of the tunable metamaterial structure 100 are shown in FIG. 1 and will now be described. It will be understood that it is not necessary for the tunable metamaterial structure 100 to have all of the elements shown in FIG. 1 or described herein. The tunable metamaterial structure 100 can have any combination of the various elements shown in FIG. 1. Further, the tunable metamaterial structure 100 can have additional elements to those shown in FIG. 1. In some arrangements, the tunable metamaterial structure 100 may not include one or more of the elements shown in FIG. 1.

The tunable metamaterial structure 100 can include a flexible substrate 102 that is elastically deformable. The flexible substrate 102 can be a compliant sheet formed from a single material. Alternatively, the flexible substrate 102 can be a compliant sheet formed from a composite material that includes multiple components. Exemplary materials can include rubber, compliant polymers, metals, metal meshes, and stretchable fabrics such as those made by including elastic fibers. However, it should be understood that these examples are not a comprehensive list and any suitable materials may be utilized to form the flexible substrate 102.

The tunable metamaterial structure 100 can include a photo-responsive stiffness-modulating patch 104. Additionally and/or alternatively, the tunable metamaterial structure 100 can include a plurality of photo-responsive stiffness-modulating patches 104 forming an array. The array can be in any suitable arrangement. As an example, the array can be in a uniform arrangement as shown or follow a specific pattern. As another example, the array can be in a random arrangement. The photo-responsive stiffness-modulating patches 104 can be uniform in size. In other words, the photo-responsive stiffness-modulating patches 104 can be of the same size. Alternatively, the photo-responsive stiffness-modulating patches 104 can vary in size. The size of the photo-responsive stiffness-modulating patches 104 can be any suitable size relative to the flexible substrate 102. The photo-responsive stiffness-modulating patches 104 can be spaced from each other, as shown. Alternatively, the photo-responsive stiffness-modulating patches 104 can be in contact with each other. In another alternative, a first portion of the photo-responsive stiffness-modulating patches 104 can be in contact and a second portion of the photo-responsive stiffness-modulating patches 104 can be spaced from each other.

The photo-responsive stiffness-modulating patches 104 can be fixed to a surface of the flexible substrate 102. Alternatively, the photo-responsive stiffness-modulating patches 104 can be embedded in the flexible substrate 102. In another alternative, a first portion of the photo-responsive stiffness-modulating patches 104 can be fixed to the surface of the flexible substrate 102 and a second portion can be embedded in the flexible substrate 102.

The tunable metamaterial structure 100 can include a lighting system 106 configured to provide light to the photo-responsive stiffness-modulating patch 104, which can include a photo-responsive element. The lighting system 106 can include at least one of a plurality of light sources arranged in an array, a light source and a lens system, and an aperture and a light source. The array of light sources can be arranged in a uniform or random pattern. The lens system can be configured to direct light from the light source to the photo-responsive stiffness-modulating patches 104 or more specifically, the photo-responsive element. The aperture can be configured to allow portions of the light from the light source to reach the photo-responsive stiffness-modulating patches 104 and the photo-responsive element.

The lighting system 106 can be arranged such that each photo-responsive element is individually illuminated. In such a case and as an example, each photo-responsive element can be illuminated by a separate light source. In such an example, the light sources can be LEDs, each directed at a single photo-responsive element, and arranged in a pattern that matches the arrangement of the photo-responsive stiffness-modulating patches 104. As another example, a material capable of blocking out light can have a plurality of apertures that are arranged such that they line up with the photo-responsive stiffness-modulating patches 104. The apertures can vary in size or be of uniform size. The apertures can have covers such that some apertures can be open and providing light to the photo-responsive elements and other apertures can be closed and blocking light from reaching the photo-responsive elements.

A first portion of the photo-responsive stiffness-modulating patches 104 and a second portion of the photo-responsive stiffness-modulating patches 104 can be at different states of illumination. In such a case and as an example, the first portion of the photo-responsive stiffness-modulating patches 104 can be at a high level of illumination and the second portion of the photo-responsive stiffness-modulating patches 104 can be at a low level of illumination. As another example, the first portion of the photo-responsive stiffness-modulating patches 104 may be illuminated and the second portion of the photo-responsive stiffness-modulating patches 104 may receive no light. The first portion of the photo-responsive stiffness-modulating patches 104 may be arranged in any suitable pattern. As an example, the first portion of the photo-responsive stiffness-modulating patches 104 that are illuminated may form a path. In such an example, a single row of photo-responsive stiffness-modulating patches 104 may be illuminated. As another example, the first portion of the photo-responsive stiffness-modulating patches 104 that are illuminated may form a zone. In such an example, a portion of the photo-responsive stiffness-modulating patches 104 that are adjacent to each other may illuminated.

Figure 2:
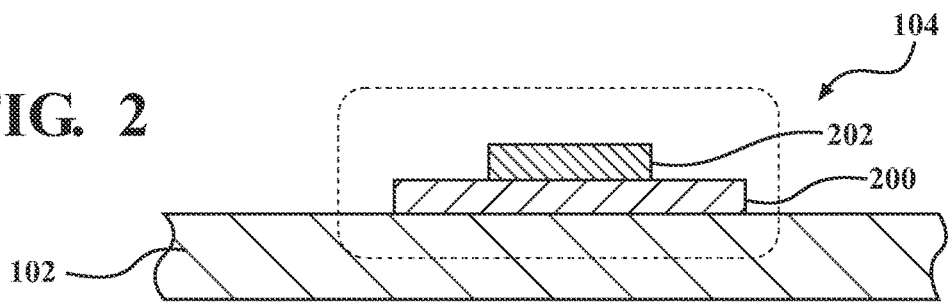
FIG. 2 is an example of a photo-sensitive stiffness-modulating patch.

Referring to FIG. 2, an example of a photo-responsive stiffness-modulating patch 104 is shown. As an example and as shown in FIG. 2, the photo-responsive stiffness-modulating patch 104 can include a piezoelectric element 200. The piezoelectric element 200 can be fixed to the flexible substrate 102 in any suitable manner. For example, as shown, the piezoelectric element 200 can be fixed to the surface of the flexible substrate 102. As an alternative, the piezoelectric element 200 can be embedded in the flexible substrate 102. The piezoelectric element 200 can be formed from piezoelectric materials such as PZT (also known as lead zirconate titanate), barium titanate, lithium niobate, or any other suitable man-made piezoelectric materials. The piezoelectric element 200 can be formed from natural materials such as quartz or other natural piezoelectric materials.

The piezoelectric element 200 can deform in response to a shunting current or voltage passing through the piezoelectric element 200. As an example, in response to a shunting current or voltage applied to the piezoelectric element 200, the piezoelectric element 200 can deform and induce stiffening or softening effect to the bonding structure. Additionally and/or alternatively, the piezoelectric element 200 can deform by expanding or contracting. As an example, the piezoelectric element 200 can deform evenly across the entire piezoelectric element 200. As another example, the piezoelectric element 200 can deform in an uneven manner. In such an example, the piezoelectric element 200 can curl if one surface of the piezoelectric element 200 contracts and the opposite surface of the piezoelectric element 200 expands.

The photo-responsive stiffness-modulating patch 104 can include a photo-responsive element 202. The photo-responsive element 202 can be fixed to the piezoelectric element 200. As an example and as shown, the photo-responsive element 202 can be mounted to a side of the piezoelectric element 200 opposite the flexible substrate 102. As another example, the photo-responsive element 202 can be embedded in the piezoelectric element 200. The photo-responsive element 202 and the piezoelectric element 200 can be arranged in any suitable manner such that the photo-responsive element 202 is capable of being illuminated by the lighting system 106.

The piezoelectric element 200 and the photo-responsive element 202 can be electrically connected to one another through negative capacitance circuits. In other words, the piezoelectric element 200 is shunted through negative capacitance circuits in which the photo-responsive element 202 is embedded in the negative capacitance circuits. The piezoelectric element 200 is configured to softening or stiffening when receiving a current or voltage from the photo-responsive element 202 via the electric circuit.

Figure 3:
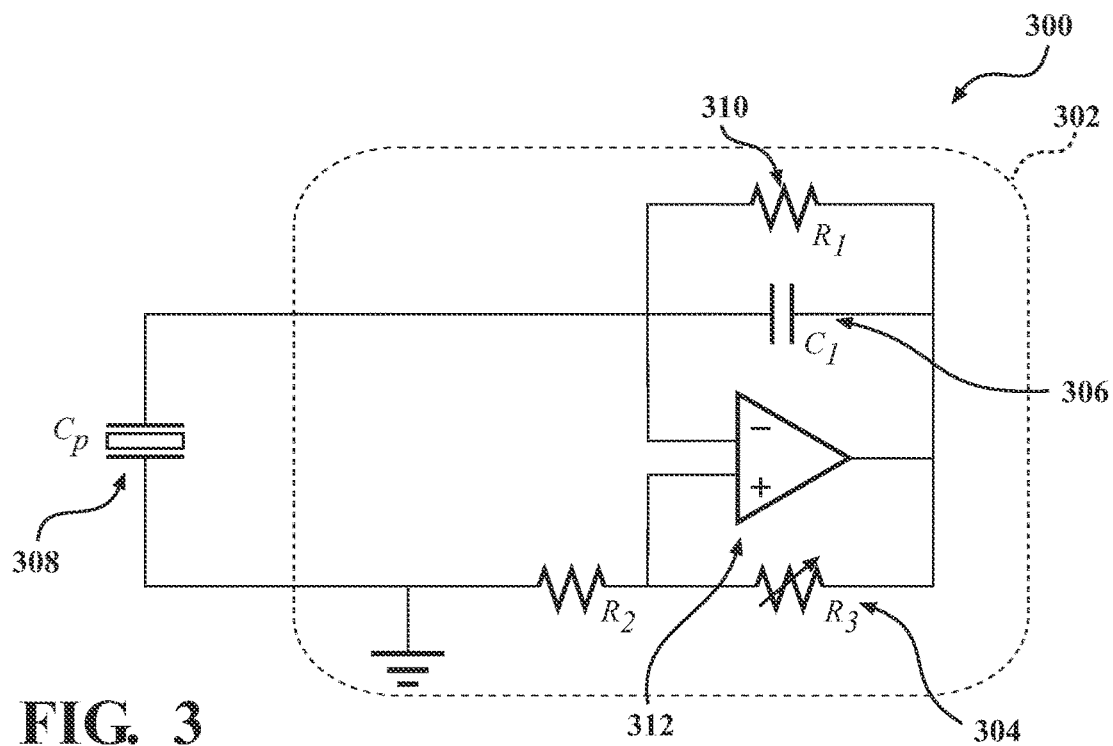
FIG. 3 is an example of a negative capacitance circuit.

Referring now to FIG. 3, an example of a softening electric circuit 300 is shown. Stiffening electric circuit can be implemented as well. The softening or stiffening circuit can also be realized through digital circuits. As mentioned above, the piezoelectric element 200 and the photo-responsive element 202 can be connected via the electric circuit 300. The photo-responsive element 202 can be configured to change the shunted impedance to the piezoelectric element 200 in response to being exposed to light. The photo-responsive element 202 can include a photo-responsive capacitance circuit. As an example and as shown, the photo-responsive capacitance circuit can include a negative capacitance circuit 302.

The photo-responsive element 202 can produce a shunting current or voltage that is provided to the piezoelectric element 200 when the photo-responsive element 202 is exposed to the lighting system 106. The photo-responsive element 202 can include a photo-resistor 304. The photo-resistor 304 can be sensitive to light. In response to being exposed to light, the resistance value of the photo-resistor 304 can reduce. The resistance value can be inversely proportional to the strength of the light. As such, the stronger the light, the lower the resistance value of the photo-resistor 304. The dimmer the light, the higher the resistance value of the photo-resistor 304. As such, the effective stiffness of the piezoelectric element 200 can respond in a linear manner to the strength of the light.

The photo-responsive element 202 can include an energy storage device such as a capacitor. The energy storage device can be configured to store energy generated when the photo-responsive element 202 is exposed to the lighting system 106 or generated by the piezoelectric element 308.

In a case where the photo-resistor 304 is no longer exposed to the light and the energy storage device has stored energy, the energy storage device can provide power to the operational amplifier element 312. The circuit 300 can include a combination of elements such as photo-resistors 304, fixed resistors 310, capacitors 306, 308, and amplifiers 312 as is suitable to alter the stiffness of the piezoelectric element 308 in response to exposure to light.

Figure 4A:
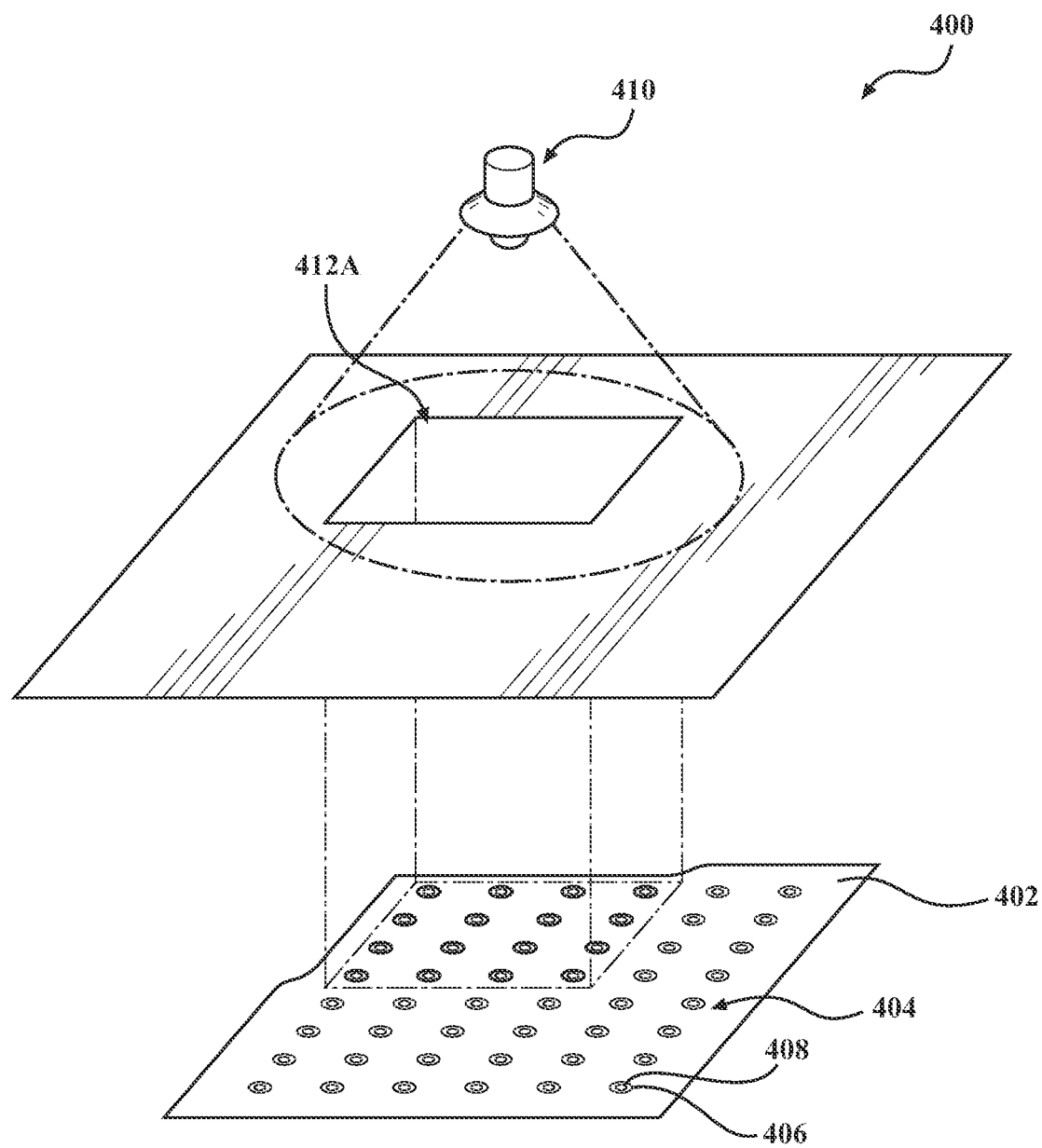
FIG. 4A-4B are examples of portions of the tunable metamaterial structure stiffening.
Figure 4B:
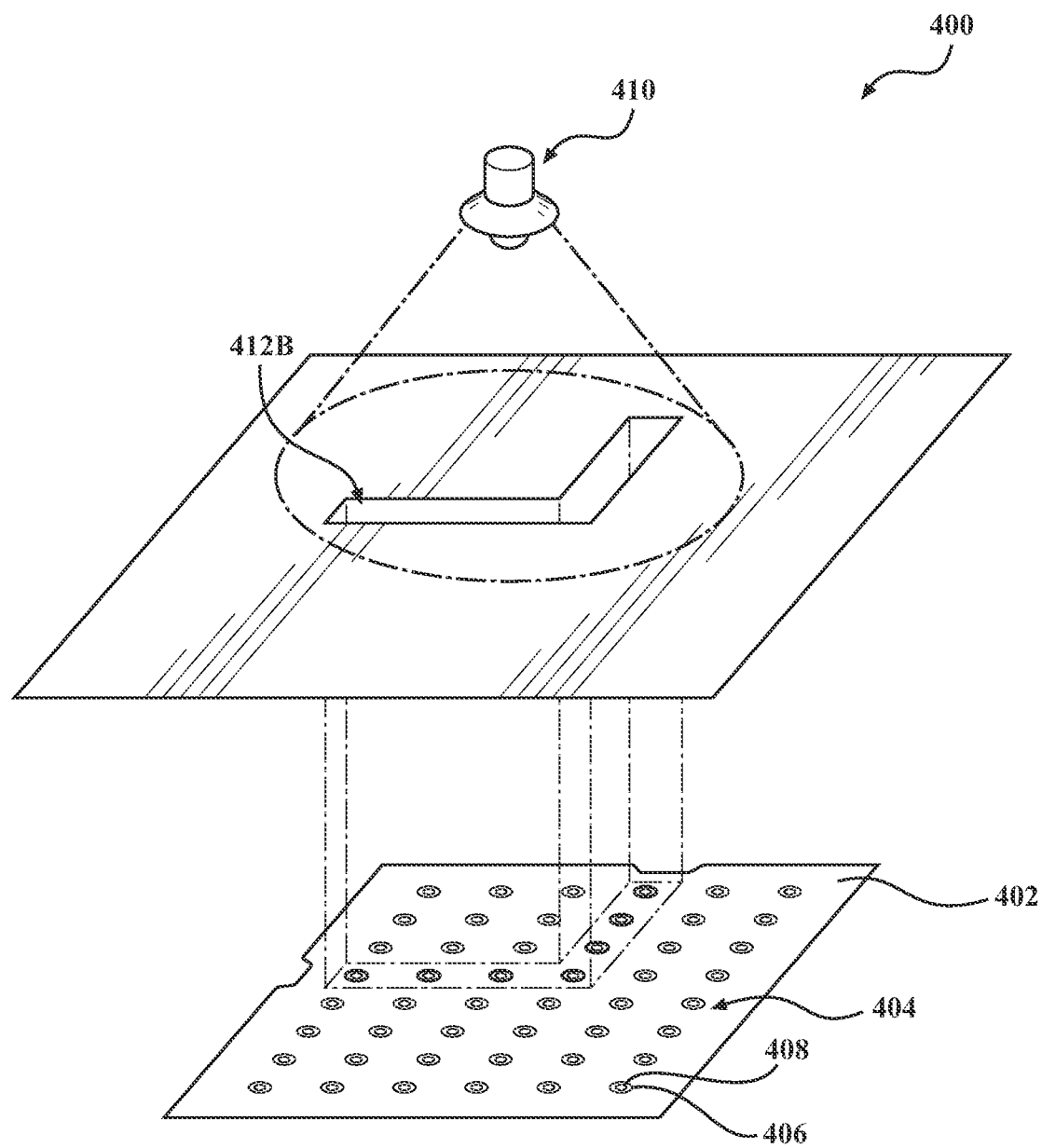

Non-limiting examples of the tunable metamaterial structure 100 will now be described in relation to FIGS. 4A-4B. FIGS. 4A-4B show examples of portions of the tunable metamaterial structure 400. The tunable metamaterial structure 400 is similar to the tunable metamaterial structure 100. Referring to FIGS. 4A-4B, a light source shines through an aperture, illuminating a portion of the tunable metamaterial.

As shown in FIG. 4A, the tunable metamaterial structure 400 has a flexible substrate 402 and a plurality of photo-responsive stiffness-modulating patches 404, arranged in a 6 by 8 grid on the flexible substrate 402. The photo-responsive stiffness-modulating patch 404 include a piezoelectric element 406 and a photo-responsive element 408. The tunable metamaterial structure 400 includes a light source 410 and an aperture 412A in the shape of a square. The light source 410 shines through the aperture 412A and illuminates a portion of the tunable metamaterial structure 400. As shown, a square-shaped zone is illuminated. In response to receiving the light, the photo-responsive element 408 allows current or voltage to be applied to the electric circuit shared by the photo-responsive element 408 and the piezoelectric element 406. In response to the current or voltage shunted to the piezoelectric element 406, the piezoelectric element 406 can stiffen or soften. The portion of the tunable metamaterial structure 400 that is in the square-shaped zone can stiffen or soften as the photo-responsive stiffness-modulating patches 404 in the square-shaped zone response to the light. As such the illuminated light controls the wave propagating behaviors on the flexible substrate 402 as shown in FIG. 4A.

As shown in FIG. 4B, the tunable metamaterial structure 400 has a flexible substrate and a plurality of photo-responsive stiffness-modulating patches 404, arranged in a 6 by 8 grid on the flexible substrate 402. The photo-responsive stiffness-modulating patch 404 includes a piezoelectric element 406 and a photo-responsive element 408. The tunable metamaterial structure 400 includes a light source 410 and an aperture 412B in the shape of an L. The light source 410 shines through the aperture 412B and illuminates a portion of the tunable metamaterial structure 400. As shown, an L-shaped path is illuminated. In response to receiving the light, the photo-responsive element 408 allows shunting current or voltage to be shunted the electric circuit shared by the photo-responsive element 408 and the piezoelectric element 406. In response to the current or voltage shunting to the piezoelectric element 406, the piezoelectric element 406 can stiffen or soften. The portion of the tunable metamaterial structure 400 that is in the L-shaped zone can stiffen or soften as the photo-responsive stiffness-modulating patches 404 in the L-shaped zone respond to light. As such the wave propagating path can be controlled in real time through the shape of illuminated light as shown in FIG. 4B.

It will be appreciated that arrangements described herein can provide numerous benefits, including one or more of the benefits mentioned herein. For example, arrangements described herein disclose a tunable metamaterial structure that is responsive to light. Arrangements described herein disclose a tunable metamaterial structure that can control elastic and acoustic waves. Arrangements described herein disclose a tunable metamaterial that has a flexible substrate that can become less flexible or more flexible. Arrangements described herein disclose a tunable metamaterial structure fabricated in a cost-effective manner with easily accessible components. Arrangements described herein disclose the elasticity of a tunable metamaterial can change in response to the tunable metamaterial being exposed to light and the elasticity of the tunable metamaterial can remain in that changed state even it is no longer exposed to the light if an energy source has a stored charge.

The flowcharts and block diagrams in the figures illustrate the architecture, functionality, and operation of possible implementations of systems, methods and computer program products according to various embodiments. In this regard, each block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

The systems, components and/or processes described above can be realized in hardware or a combination of hardware and software and can be realized in a centralized fashion in one processing system or in a distributed fashion where different elements are spread across several interconnected processing systems. Any kind of processing system or other apparatus adapted for carrying out the methods described herein is suited. A typical combination of hardware and software can be a processing system with computer-usable program code that, when being loaded and executed, controls the processing system such that it carries out the methods described herein. The systems, components and/or processes also can be embedded in a computer-readable storage, such as a computer program product or other data programs storage device, readable by a machine, tangibly embodying a program of instructions executable by the machine to perform methods and processes described herein. These elements also can be embedded in an application product which comprises all the features enabling the implementation of the methods described herein and, which when loaded in a processing system, is able to carry out these methods.

Furthermore, arrangements described herein may take the form of a computer program product embodied in one or more computer-readable media having computer-readable program code embodied or embedded, e.g., stored, thereon. Any combination of one or more computer-readable media may be utilized. The computer-readable medium may be a computer-readable signal medium or a computer-readable storage medium. The phrase "computer-readable storage medium" means a non-transitory storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: an electrical connection having one or more wires, a portable computer diskette, a hard disk drive (HDD), a solid state drive (SSD), a random access memory (RAM), a read-only memory (ROM), an erasable programmable read-only memory (EPROM or Flash memory), an optical fiber, a portable compact disc read-only memory (CD-ROM), a digital versatile disc (DVD), an optical storage device, a magnetic storage device, or any suitable combination of the foregoing. In the context of this document, a computer-readable storage medium may be any tangible medium that can contain or store a program for use by or in connection with an instruction execution system, apparatus, or device.

Program code embodied on a computer-readable medium may be transmitted using any appropriate medium, including but not limited to wireless, wireline, optical fiber, cable, RF, etc., or any suitable combination of the foregoing. Computer program code for carrying out operations for aspects of the present arrangements may be written in any combination of one or more programming languages, including an object-oriented programming language such as Java™, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

As used herein, the term "substantially" or "about" includes exactly the term it modifies and slight variations therefrom. Thus, the term "substantially equal" means exactly equal and slight variations therefrom. "Slight variations therefrom" can include within 15 percent/units or less, within 14 percent/units or less, within 13 percent/units or less, within 12 percent/units or less, within 11 percent/units or less, within 10 percent/units or less, within 9 percent/units or less, within 8 percent/units or less, within 7 percent/units or less, within 6 percent/units or less, within 5 percent/units or less, within 4 percent/units or less, within 3 percent/units or less, within 2 percent/units or less, or within 1 percent/unit or less. In some instances, "substantially" can include being within normal manufacturing tolerances.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e. open language). The phrase "at least one of . . . and . . . " as used herein refers to and encompasses any and all possible combinations of one or more of the associated listed items. As an example, the phrase "at least one of A, B and C" includes A only, B only, C only, or any combination thereof (e.g., AB, AC, BC or ABC).

Aspects herein can be embodied in other forms without departing from the spirit or essential attributes thereof. Accordingly, reference should be made to the following claims, rather than to the foregoing specification, as indicating the scope of the invention.

What is claimed is:

1. A tunable metamaterial structure comprising:
   a flexible substrate that is elastically deformable; and
   a photo-responsive stiffness-modulating patch fixed to a surface of the flexible substrate, the photo-responsive stiffness-modulating patch including a piezoelectric element and a photo-responsive element, wherein the piezoelectric element and the photo-responsive element are electrically connected to one another.

2. The tunable metamaterial structure of claim 1, wherein the photo-responsive element includes one or more negative capacitance circuits.

3. The tunable metamaterial structure of claim 1, wherein the photo-responsive element is mounted to a side of the piezoelectric element opposite the flexible substrate.

4. The tunable metamaterial structure of claim 1, further comprises a plurality of photo-responsive stiffness-modulating patches fixed to the surface of the flexible substrate.

5. The tunable metamaterial structure of claim 4, wherein a first portion of the plurality of the photo-responsive stiffness-modulating patches and a second portion of the plurality of the photo-responsive stiffness-modulating patches are at different states of illumination.

6. The tunable metamaterial structure of claim 5, wherein the first portion of the plurality of the photo-responsive stiffness-modulating patches form a path.

7. The tunable metamaterial structure of claim 5, wherein the first portion of the plurality of the photo-responsive stiffness-modulating patches form a zone.

8. The tunable metamaterial structure of claim 1, further comprises a lighting system configured to provide light to the photo-responsive element.

9. The tunable metamaterial structure of claim 8, wherein the lighting system comprises at least one of:
   a plurality of light sources arranged in an array;
   a light source and a lens system, the lens system configured to direct light from the light source to the photo-responsive element; and
   an aperture and a light source, wherein the aperture is configured to allow portions of the light from the light source to reach the photo-responsive element.

10. The tunable metamaterial structure of claim 1, wherein the photo-responsive element produces a shunting impedance that is provided to the piezoelectric element when exposed to a light source.

11. The tunable metamaterial structure of claim 1, wherein the piezoelectric element is configured to change its effective stiffness when receiving a shunting current or voltage from the photo-responsive element.

12. The tunable metamaterial structure of claim 1, wherein the photo-responsive element includes an energy storage device that is configured to store energy generated when the photo-responsive element is exposed to a light source or generated by the piezoelectric element.

13. The tunable metamaterial structure of claim 12, wherein the photo-responsive element is configured to provide a shunting current or voltage to the piezoelectric element from a negative capacitance circuit.

14. The tunable metamaterial structure of claim 13, wherein the photo-responsive element is configured to provide the shunting current or voltage to the piezoelectric element from the negative capacitance circuit powered by the energy storage device or an external power source.

15. A tunable metamaterial structure comprising:
    a flexible substrate that is elastically deformable; and
    a plurality of photo-responsive stiffness-modulating patches fixed to a surface of the flexible substrate and forming an array, the photo-responsive stiffness-modulating patch including a piezoelectric element and a photo-responsive element, wherein the piezoelectric element and the photo-responsive element are electrically connected to one another.

16. The tunable metamaterial structure of claim 15, wherein the photo-responsive element includes one or more negative capacitance circuits.

17. The tunable metamaterial structure of claim 15, wherein a first portion of the plurality of photo-responsive stiffness-modulating patches and a second portion of the plurality of photo-responsive stiffness-modulating patches are in contact.

18. The tunable metamaterial structure of claim 15, further comprises a lighting system configured to provide light to the photo-responsive element of a portion of the plurality of photo-responsive stiffness-modulating patches.

19. The tunable metamaterial structure of claim 15, wherein the array is a random arrangement or follow a specific pattern.

20. The tunable metamaterial structure of claim 15, wherein the plurality of photo-responsive stiffness-modulating patches are the same size or vary in size.

* * * * *